(12) United States Patent
Doris et al.

(10) Patent No.: US 7,569,446 B2
(45) Date of Patent: Aug. 4, 2009

(54) SEMICONDUCTOR STRUCTURE AND METHOD OF MANUFACTURE

(75) Inventors: Bruce B. Doris, Brewster, NY (US); Thomas W. Dyer, Pleasant Valley, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 11/761,466

(22) Filed: Jun. 12, 2007

(65) Prior Publication Data

US 2008/0311714 A1 Dec. 18, 2008

(51) Int. Cl.
*H01L 21/8238* (2006.01)
(52) U.S. Cl. ............... 438/199; 438/229; 257/E21.63
(58) Field of Classification Search .......... 438/199, 438/229; 257/369
See application file for complete search history.

(56) References Cited

U.S. PATENT DOCUMENTS

| 6,645,818 | B1 | 11/2003 | Sing et al. |
| 7,067,368 | B1 | 6/2006 | Fang et al. |
| 7,432,567 | B2* | 10/2008 | Doris et al. ............ 257/407 |
| 7,485,521 | B2* | 2/2009 | Zhu et al. ............. 438/199 |

* cited by examiner

*Primary Examiner*—Phat X Cao
*Assistant Examiner*—Nga Doan
(74) *Attorney, Agent, or Firm*—Rosa S. Yaghmour; Greenblum & Bernstein P.L.C.

(57) ABSTRACT

A complimentary metal oxide semiconductor and a method of manufacturing the same using a self-aligning process to form one of the stacks of device. The method includes depositing an oxide layer over a portion of a metal layer over an nFET region of a CMOS structure and etching the metal layer over a pFET region of the CMOS structure. The method further includes etching at the oxide layer over the nFET region and forming gate structures over the nFET region and pFET region.

1 Claim, 17 Drawing Sheets

SEMICONDUCTOR STRUCTURE AND METHOD OF MANUFACTURE

FIELD OF THE INVENTION

The invention relates to a semiconductor structure and method of manufacturing a semiconductor structure and, more particularly, to a complimentary metal oxide semiconductor device and a method of manufacturing the same using a self-aligning process to form a stack of the device.

BACKGROUND DESCRIPTION

The fabrication of semiconductor devices includes a complex array of fabrication processes. By example, in known fabrication process of CMOS devices, several lithographic steps are required to build the gate stacks for the nFET and the pFET. These lithographic steps add additional fabrication costs to the building of the device, in addition to leading to alignment errors.

More specifically, lithographic steps to form the gate structures present alignment errors typically leading to stringers formed in the shallow trench isolation structure (STI) between the nFET and pFET regions of the device. These stringers, in turn, lead to performance issues related to the device. As should be understood, stringers are formed by damage which occurs to the surface of the STI during etching, stripping and subsequent deposition processes of the gate structures.

More specifically, in forming a CMOS device, an STI is formed in the substrate. After several layers building up the structure, e.g., sacrificial oxide layers, a poly layer, etc., a photoresist litho layer (mask) is formed over the pFET region of the structure, which is used to protect the pFET region during a subsequent poly removal process. After etching and stripping processes, a thin oxide layer is grown over the nFET region and a dielectric layer and metal layer are formed over the oxide layer.

A mask is then formed on the metal layer over the nFET region. As it is not possible to precisely align the mask over the nFET region, the device is designed with a margin of error. Due to this margin of error, the mask can either overlay onto a pFET side of the STI or, alternatively, extend only partially over the STI on the nFET side. In the latter situation, a gap is formed in the structure exposing the underlying metal layer on the STI. During the etching process, the exposed metal layer and dielectric layer in this gap are etched away, leaving behind a separation space, i.e., an exposed portion of the STI. During the resist strip (or even the etching), the exposed portion of the STI region becomes damaged. This damaged portion becomes filled during the poly deposition process to form the gate stacks of the nFET and pFET. This filled portion is known as a stringer which negatively affects the device performance.

Basically, as should be understood, the stringer is formed due misalignment of the block mask over the nFET region. This block mask not only results in the misalignment and hence the subsequent formation of the stringer, it also adds additional processing steps and costs to the manufacturing process of the device. Accordingly, there exists a need in the art to overcome the deficiencies and limitations described hereinabove.

SUMMARY OF THE INVENTION

In a first aspect of the invention, a method comprises depositing an oxide layer over a portion of a metal layer over an nFET region of a CMOS structure and etching the metal layer over a pFET region of the CMOS structure. The method further includes etching the oxide layer over the nFET region and forming gate structures over the nFET region and pFET region.

In another aspect of the invention, a method of forming a structure comprises forming an STI in a substrate between an nFET region and a pFET region and depositing a metal layer over the STI and substrate over the nFET region and pFET region. The metal layer has a stepped portion. The method further comprises forming a self-aligning oxide layer over the metal layer over the nFET region.

In yet another aspect of the invention, a structure comprises an STI formed between an nFET region and a pFET region. The STI is devoid of stringers. A gate stack is formed over the nFET region and the pFET region.

DETAILED DESCRIPTION OF EMBODIMENTS OF THE INVENTION

The invention relates to a semiconductor structure and method of manufacturing a semiconductor structure and, more particularly, to a complimentary metal oxide semiconductor device and a method of manufacturing the same using a self-aligning process to form one of the gate stacks of the device. More particularly, the method of the invention uses a single lithography level to define the first gate stack of the structure and a process sequence that self-aligns the second gate stack to the first gate stack. In the manner described herein, the method eliminates a lithography level and overlay region or gap that is formed between the two gate stack regions. The method of the invention effectively eliminates alignment errors and minimizes the costs attributable to using an additional lithography level.

Figure 1:
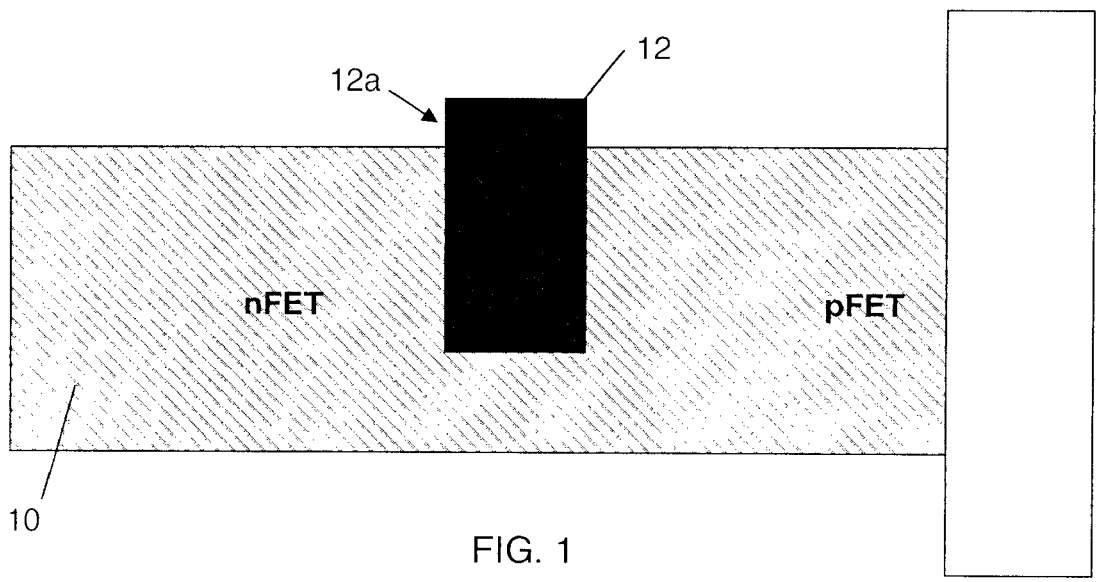
FIG. 1 shows a beginning structure in accordance with an embodiment of the invention.

FIG. 1 shows a beginning structure in accordance with the invention. The beginning structure includes a substrate 10, which can comprise any known materials such as Si or BOX (buried oxide in SOI substrates). A shallow trench isolation structure (STI) 12 is formed in the substrate 10 using any conventional patterning process. The STI 12 provides an isolation structure between an nFET and pFET, which will be formed in accordance with the processes of the invention. In embodiments, a step 12a is formed between the STI 12 and a surface of the substrate 10, which is typically formed by stripping a nitride layer during the formation of the STI 12.

Figure 2:
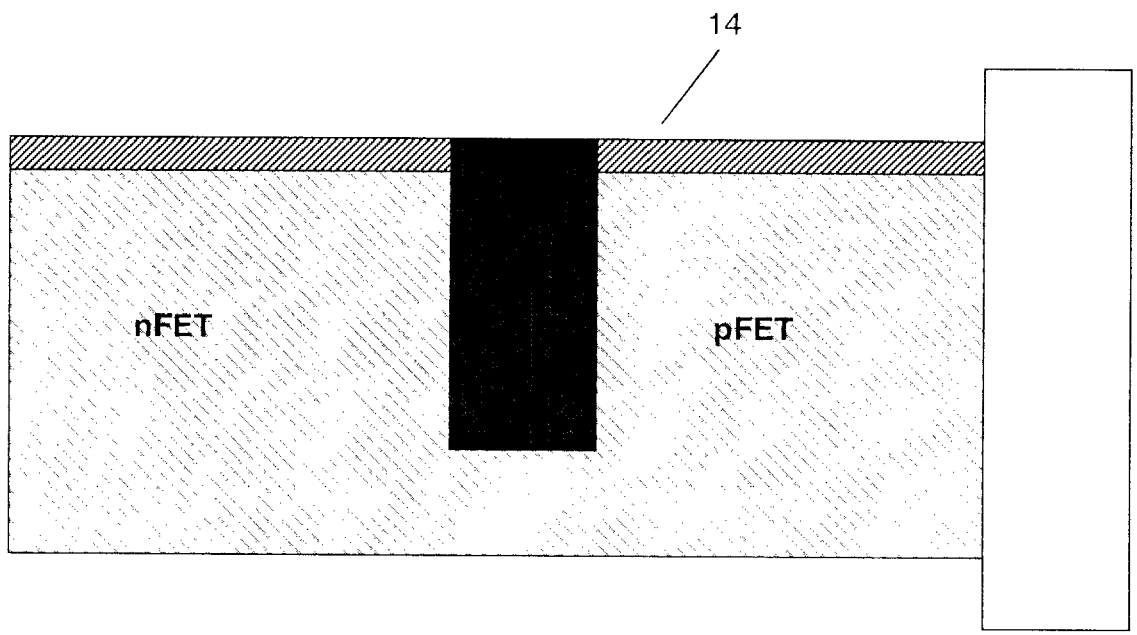
FIGS. 2-15 show intermediate structures and respective processing steps in accordance with embodiments of the invention.

In the processing shown in FIG. 2, a sacrificial oxide layer 14 is grown over the structure of FIG. 1. More specifically, the oxide layer 14 is $SiO_2$ which is approximately 10-20 Å in thickness and more preferably about 15 Å in thickness.

Figure 3:
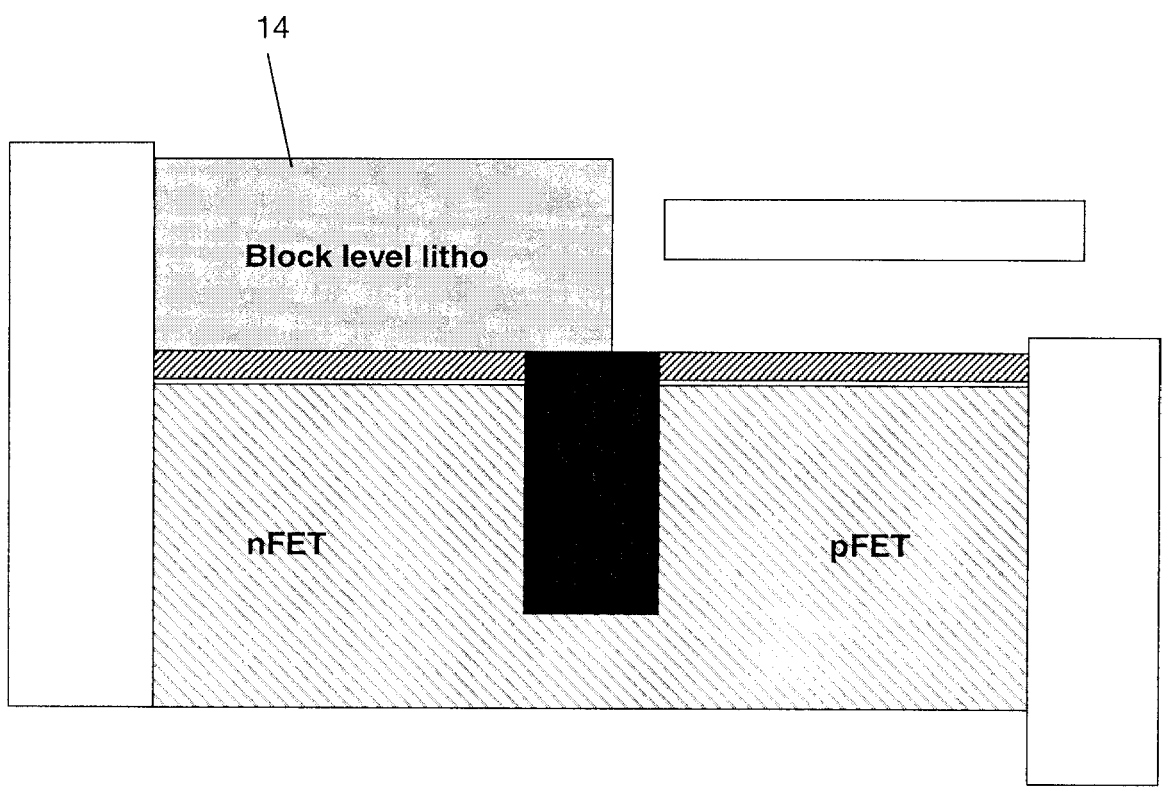

In the processing of FIG. 3, a block litho 14 is formed over the nFET region of the substrate. The formation of the block litho 14 can be provided in any conventional manner such as by a resist, exposure and patterning process known to those of skill in the art.

Figure 4:
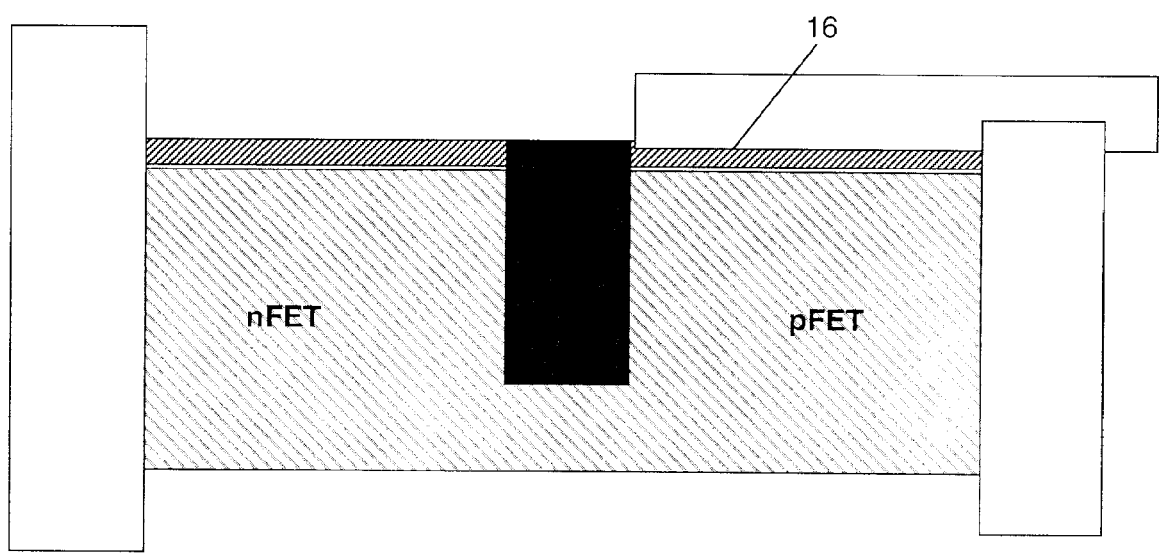

In FIG. 4, the $SiO_2$ of FIG. 3 is stripped using conventional processes. Also, the block litho 14 is removed. In the processing shown in FIG. 4, a thin oxide layer 16 is formed over the pFET region. The oxide layer 16 is, in one embodiment, $SiO_2$ and has a thickness of less than the $SiO_2$ formed over the nFET region of FIG. 3.

Figure 5:
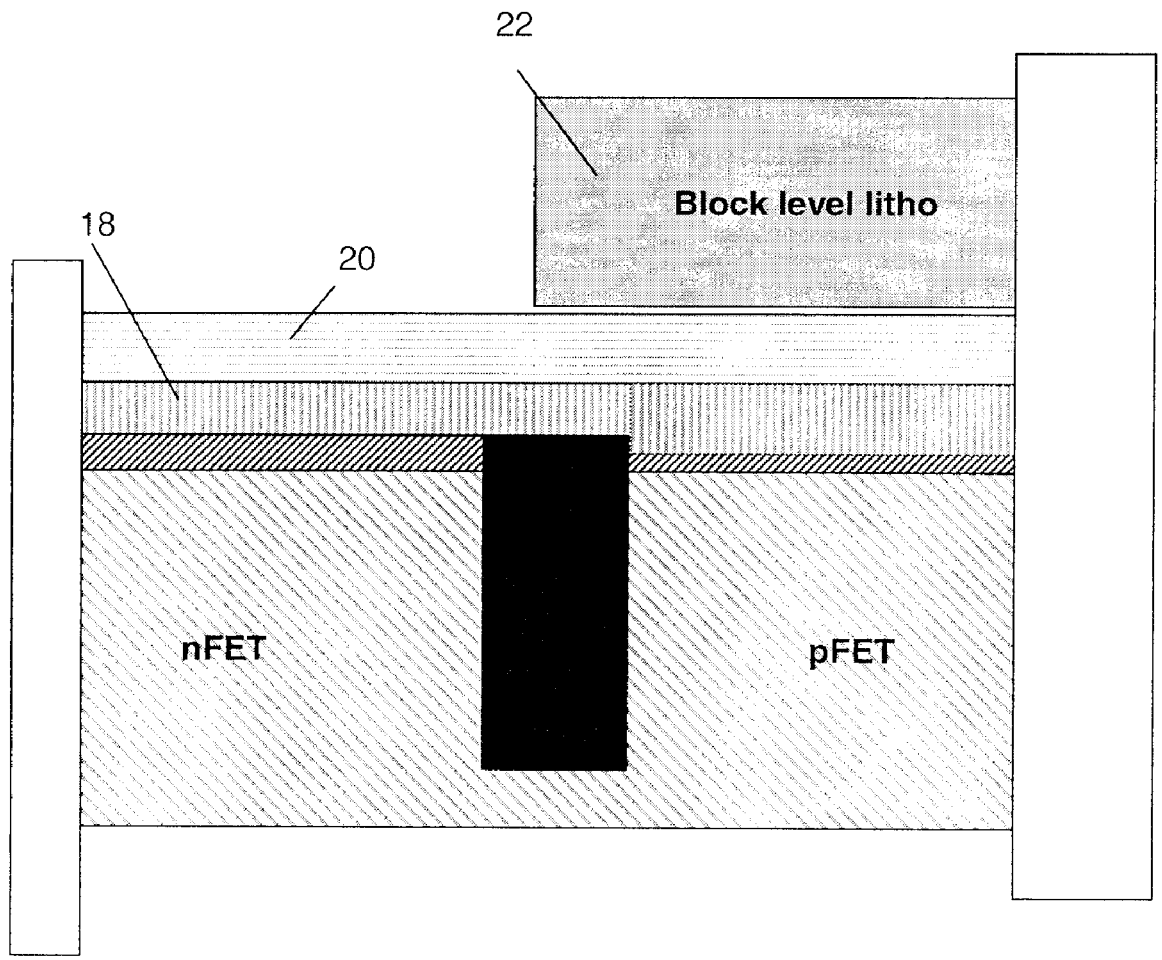

In the processing of FIG. 5, a poly layer 18 is deposited on the $SiO_2$ layers. The poly layer 18 has a thickness of about between 100 Å and 1500 Å and more preferably between 100 Å and 1000 Å and even more preferably between 100 Å and 500 Å and most preferably about 200 Å. A $SiO_2$ layer 20 is deposited over the poly layer 18. In embodiments, the $SiO_2$ layer 20 has a thickness of about between 500 Å and 2000 Å, and more preferably has a thickness sufficient for the self aligning processes of the invention as discussed herein. A photoresist litho layer (mask) 22 is formed over the pFET region of the structure, which is used to protect the pFET region during a subsequent poly removal process.

Figure 6:
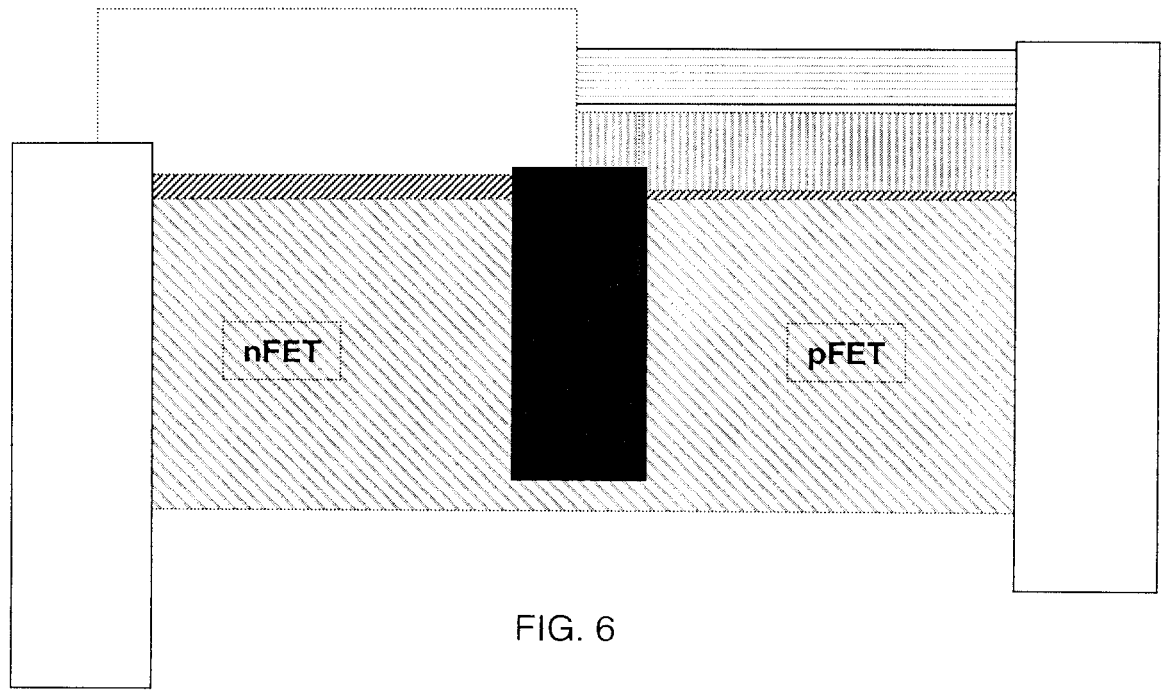

In FIG. 6, the poly layer 18 and $SiO_2$ layer 20 are stripped over the nFET region. In this process, the photoresist litho layer 22 protects the poly layer 18 and $SiO_2$ layer 20 over the pFET region of the structure.

Figure 7:
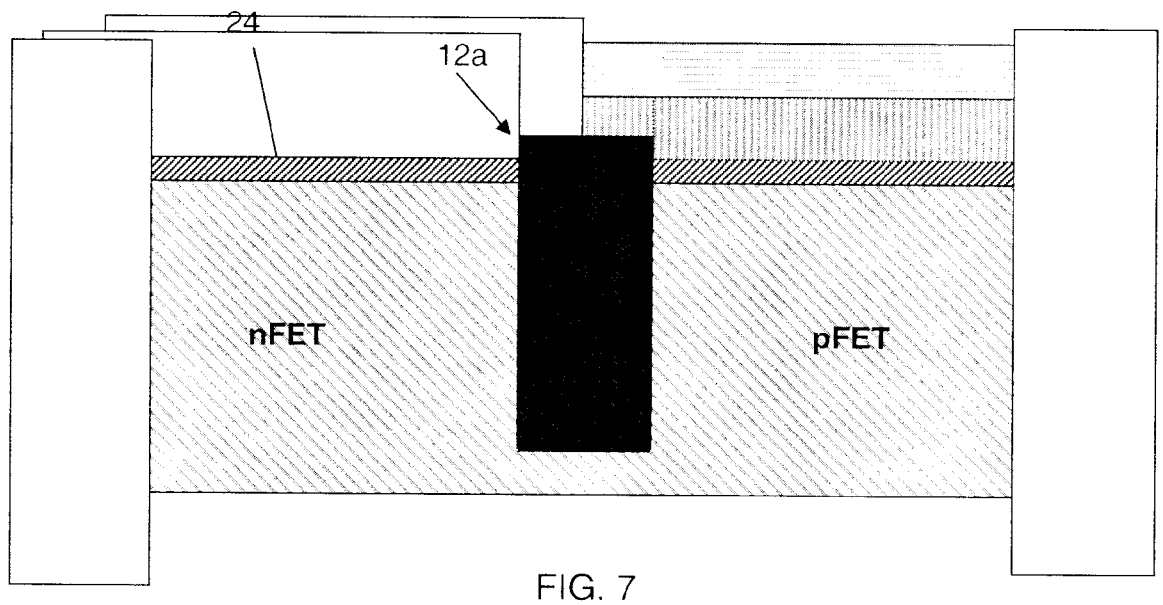

In the processing shown in FIG. 7, the gate dielectric is precleaned with, for example, a standard precleaning process such as a dilute HF solution. The standard precleaning process prepares the surface of the structure for further processing. A chemical oxide layer 24 is grown over the nFET region using known methods. The chemical oxide layer 24 is about 2 Å to 5 Å in thickness; although, other thicknesses are contemplated by the invention. In embodiments, the upper surface of the chemical oxide layer 24 is lower than a surface of the STI 12, leaving a portion of the step 12a, now formed between the oxide layer 24 and the STI 12.

Figure 8:
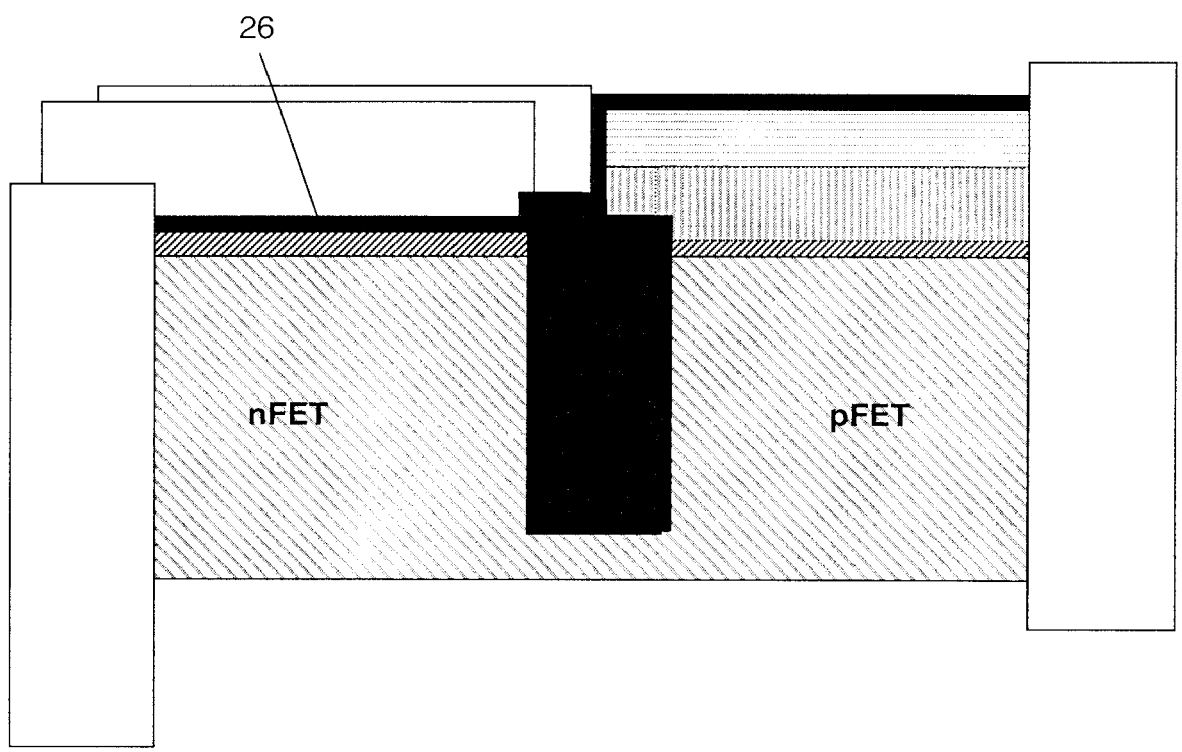

In the processing shown in FIG. 8, a dielectric layer 26 is formed over the structure. The dielectric layer 26 can be any high-K dielectric formed in a standard method such as, for example, MOCVD. In embodiments, the dielectric 26 may be a different material than the oxide layer 16. In embodiments, the dielectric layer 26 may be about 20 nm to 40 nm in thickness.

Figure 9:
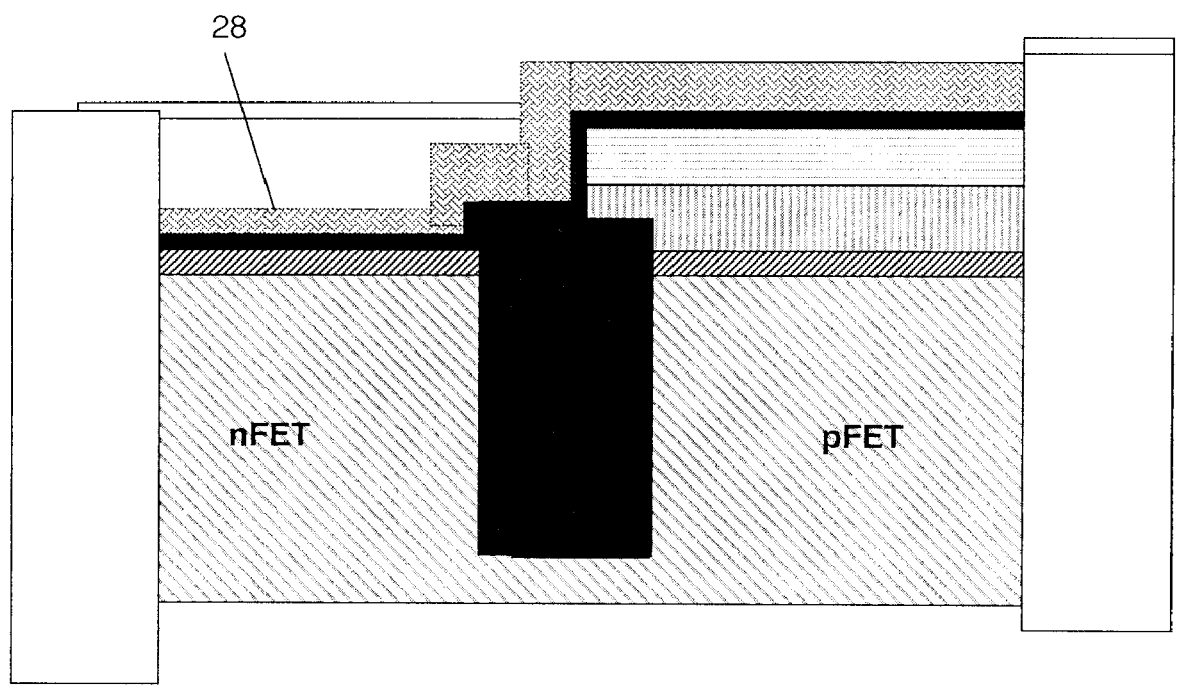

In the processing shown in FIG. 9, a metal layer 28 such as, for example, TiN is formed over the dielectric layer 26. As shown in FIG. 9, the step 12a remains and, in embodiments, is accentuated by the deposition of the dielectric layer 26 and metal layer 28. As should be recognized, the processes of FIGS. 2 through 9 are shown as a non-limiting exemplary illustration of the invention. As such, other processing steps and intermediate structures are contemplated in accordance with the invention.

Figure 10:
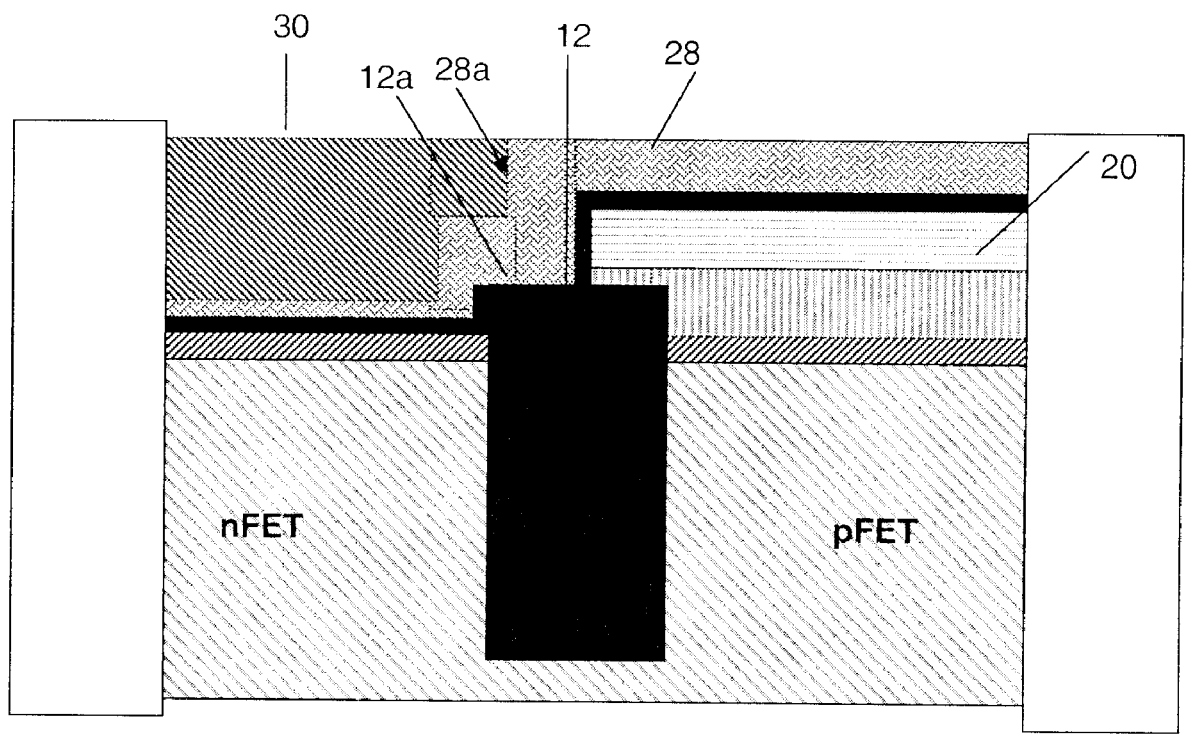

In the process steps shown in FIG. 10, an oxide layer 30 is deposited on the metal layer 28, over the nFET region. The oxide layer 30 is also deposited over a portion of the STI 12, including the step portion 12a. The use of the oxide layer 30 eliminates the need for additional lithographic processing steps, which results in alignment errors, a separation over the STI 12 and any subsequent formation of stringers in the STI 12.

In the processing steps of FIG. 10, the oxide layer 30 is first deposited over the entire structure, including the raised portion of the metal layer 28 over the pFET region. The oxide layer 30 is then polished or planarized using a conventional CMP process. The polishing exposes a portion of the metal layer 28 (e.g., TiN layer) over the pFET region and a portion of the STI 12. That is, the oxide layer 30 is planarized to such an extent that the surface of the oxide layer 30 and the metal layer 28 over the pFET region and a portion of the STI 12 are planar. In this processing, as shown in FIG. 10, the oxide layer 30 remains butted against a portion 28a of the metal layer 28, thereby ensuring that there is no overlay or gap present. In the manner described, the oxide layer 30 is self-aligned over the nFET region.

To the degree that the metal layer 28 is exposed, the nFET region and pFET region remain protected by at least the metal layer 28. As should be recognized, the layer 20 was made sufficiently thick, e.g., lifting the layer 20 over the pFET region compared to the nFET region, for the deposition of the oxide layer 30 to be self aligned.

Figure 11:
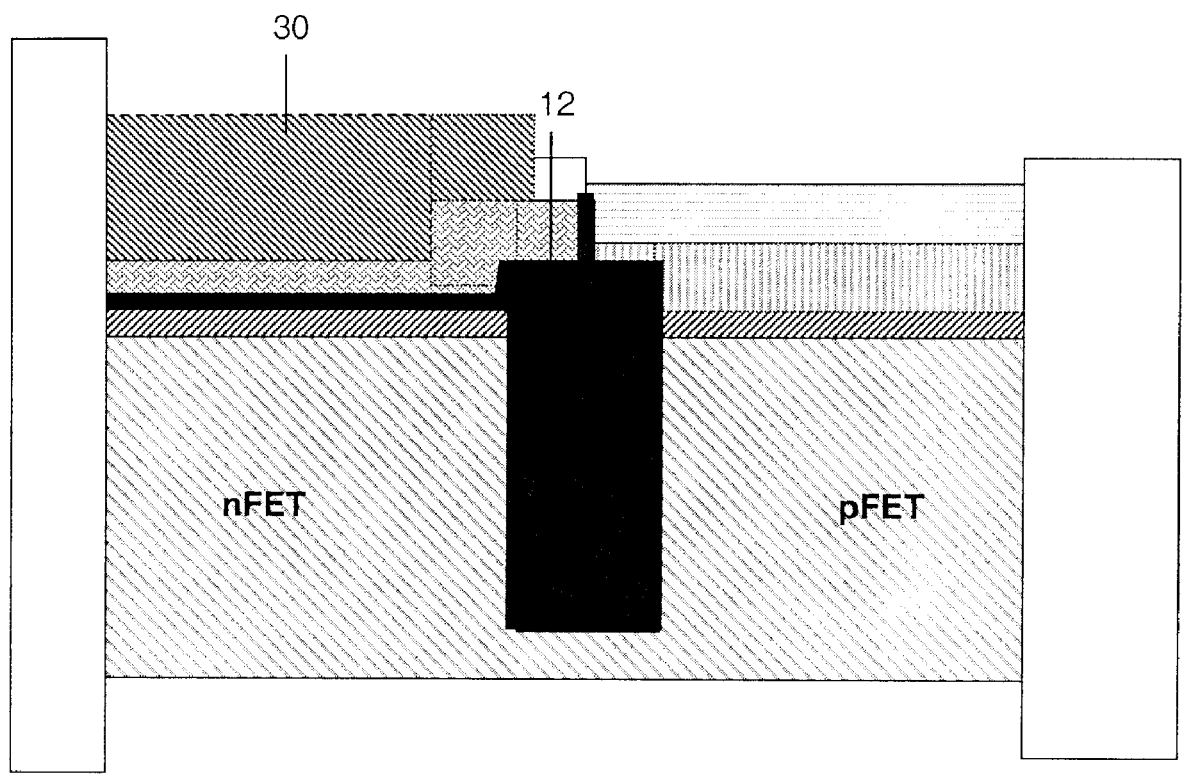

In the processing steps shown in FIG. 11, the exposed metal layer 28 over the pFET region is etched using a conventional process such as, for example, $HfO_2$ etching processing. This etching also etches a portion of the metal layer 28 over the STI region 12, which is not protected by the oxide layer 30.

As shown, the oxide layer 30 remains butted against the metal layer 28 over a portion of the STI. In further embodiments, the oxide layer 30 may be butted against other materials, over or remotely from the STI. In these further embodiments, the oxide layer, due to the intermediate structures and processing steps, remains self-aligned over the nFET region.

Figure 12:
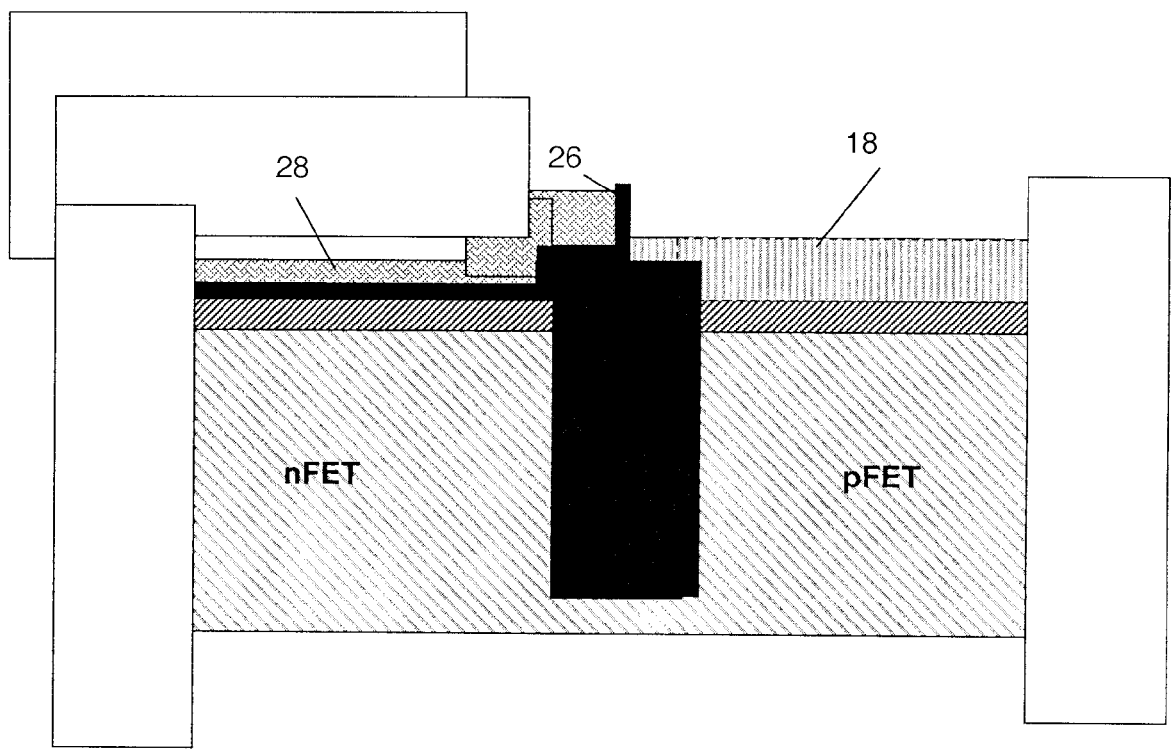

In the processing steps shown in FIG. 12, the oxide layer 30 of FIG. 11 is etched away over the nFET region, leaving the metal layer 28 exposed over the nFET region. In this processing step, the layer 18 over the pFET region is also etched away. The etching can be performed using any conventional etching processes such as, for example, a buffered HF or dilute HF process.

As shown in FIG. 12, even after the etching, there is no gap over the STI; instead, the metal layer 28 remains butted against the dielectric layer 26 which is, in turn, butted against the poly layer 18, with no gap or overlay. This fit protects the underlying STI 12 from etching and subsequent formation of stringers. Also, this structure is provided without the need for an additional lithographic step, as in conventional fabrication methods.

Figure 13:
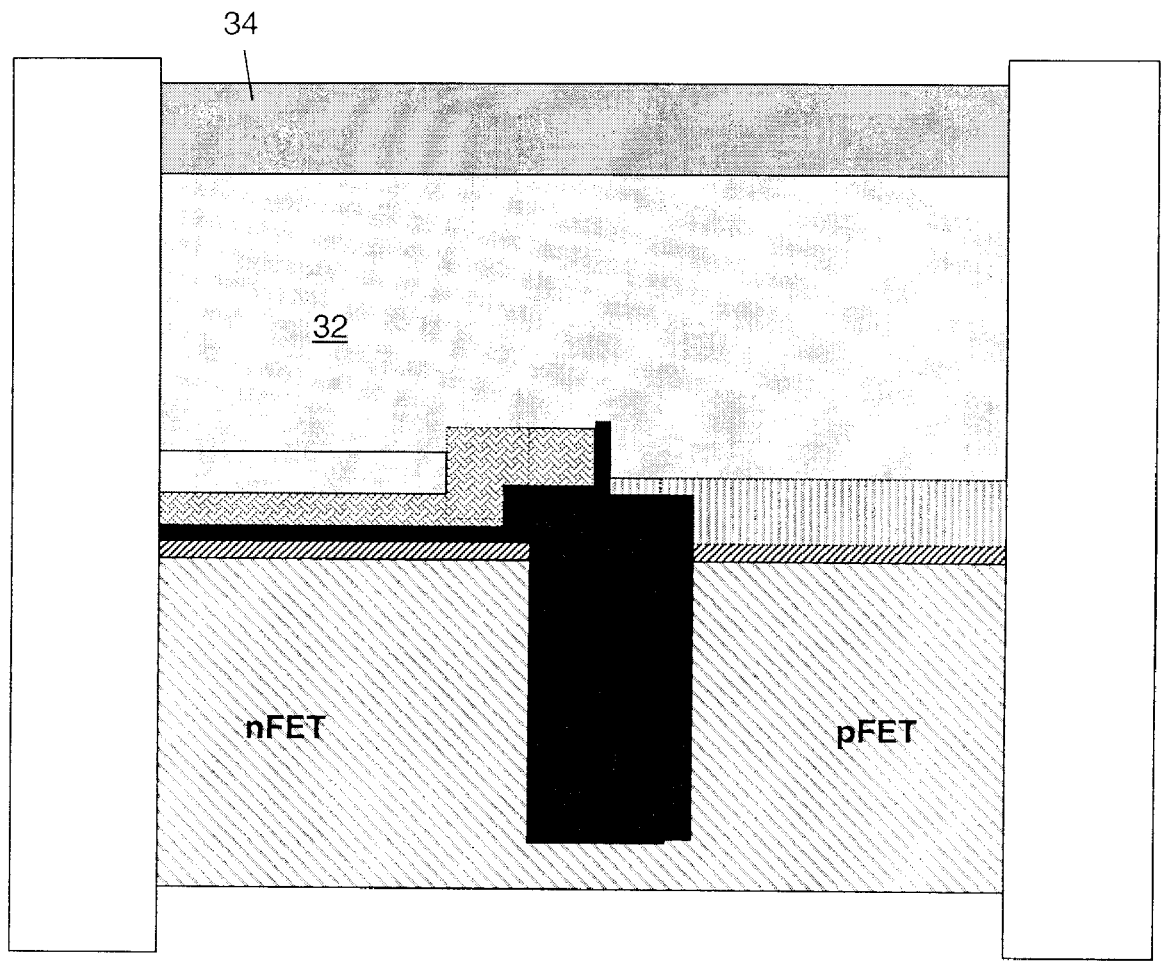
Figure 14:
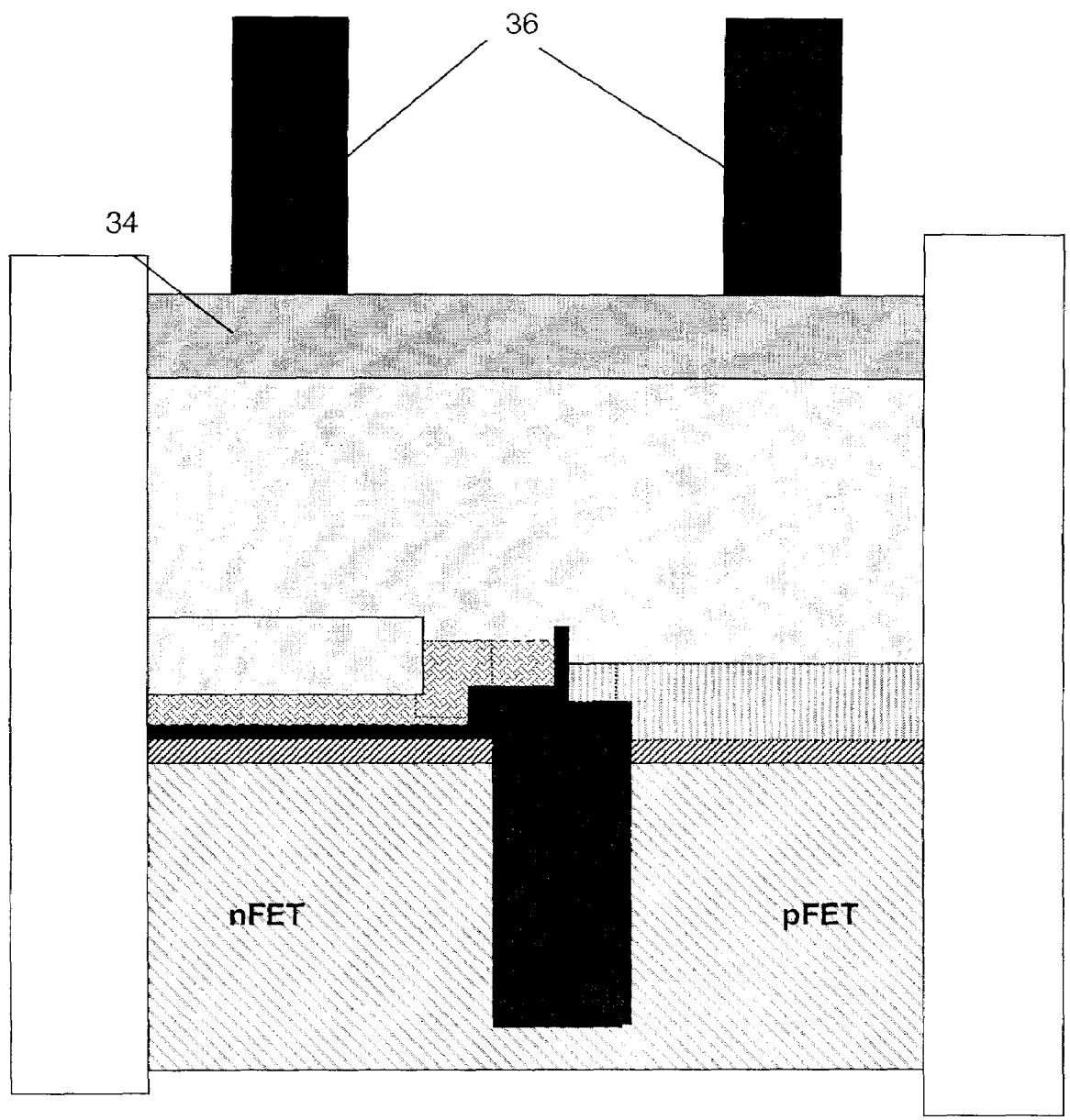

FIGS. 13-16 show additional processing to form the gates over the nFET and pFET regions, in accordance with the invention. In FIG. 13, a poly layer 32 and hard mask layer 34 are deposited over the formed structure of FIG. 12. The hard mask layer 34 is preferably a $SiO_2$; although any other known hard mask material may be used with the invention. In FIG. 14, a resist 36 is imaged over the hard mask 34, to form the gate stacks of the nFET and pFET. In FIG. 14, the resist 36 and portions of the hard mask 34 are also removed.

Figure 15:
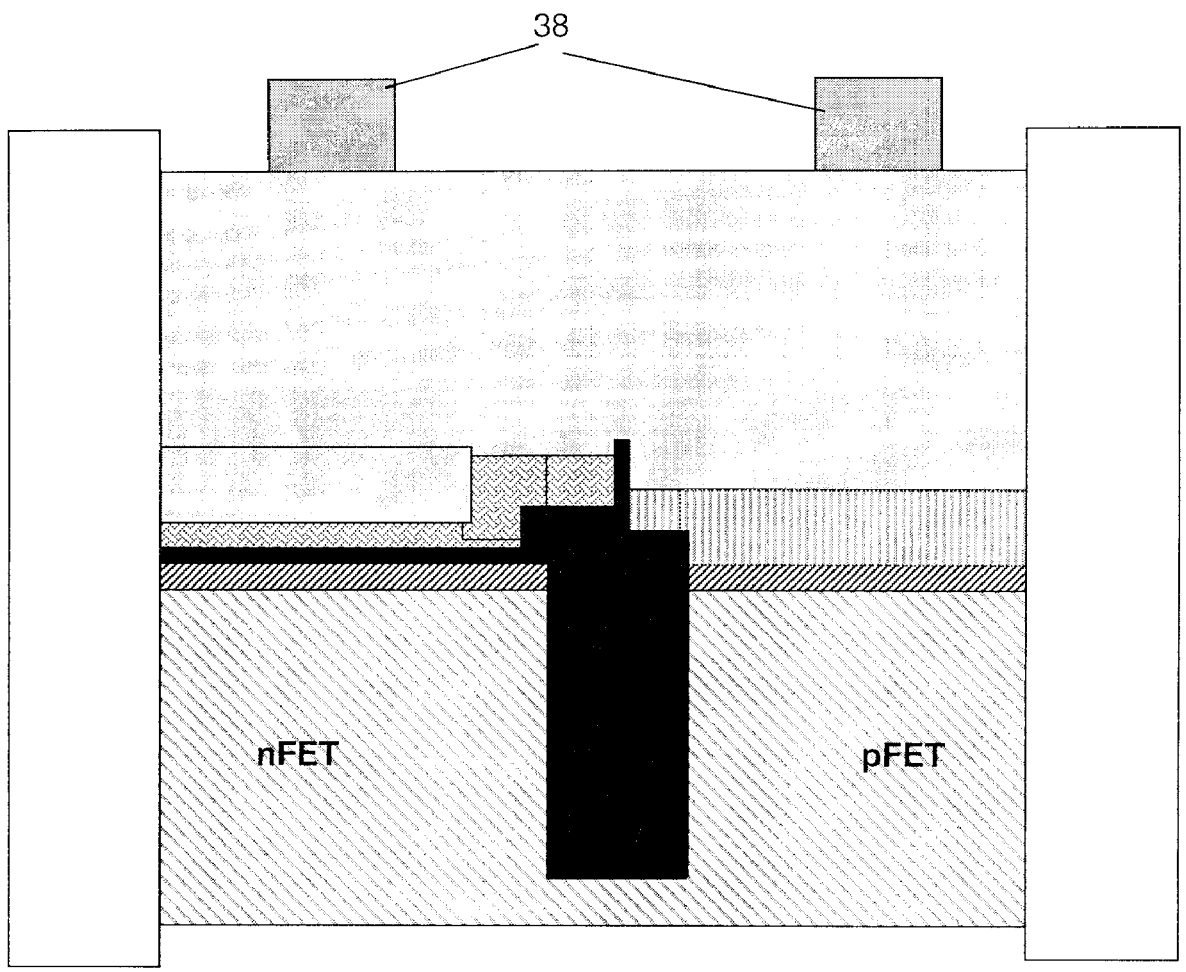
Figure 16:
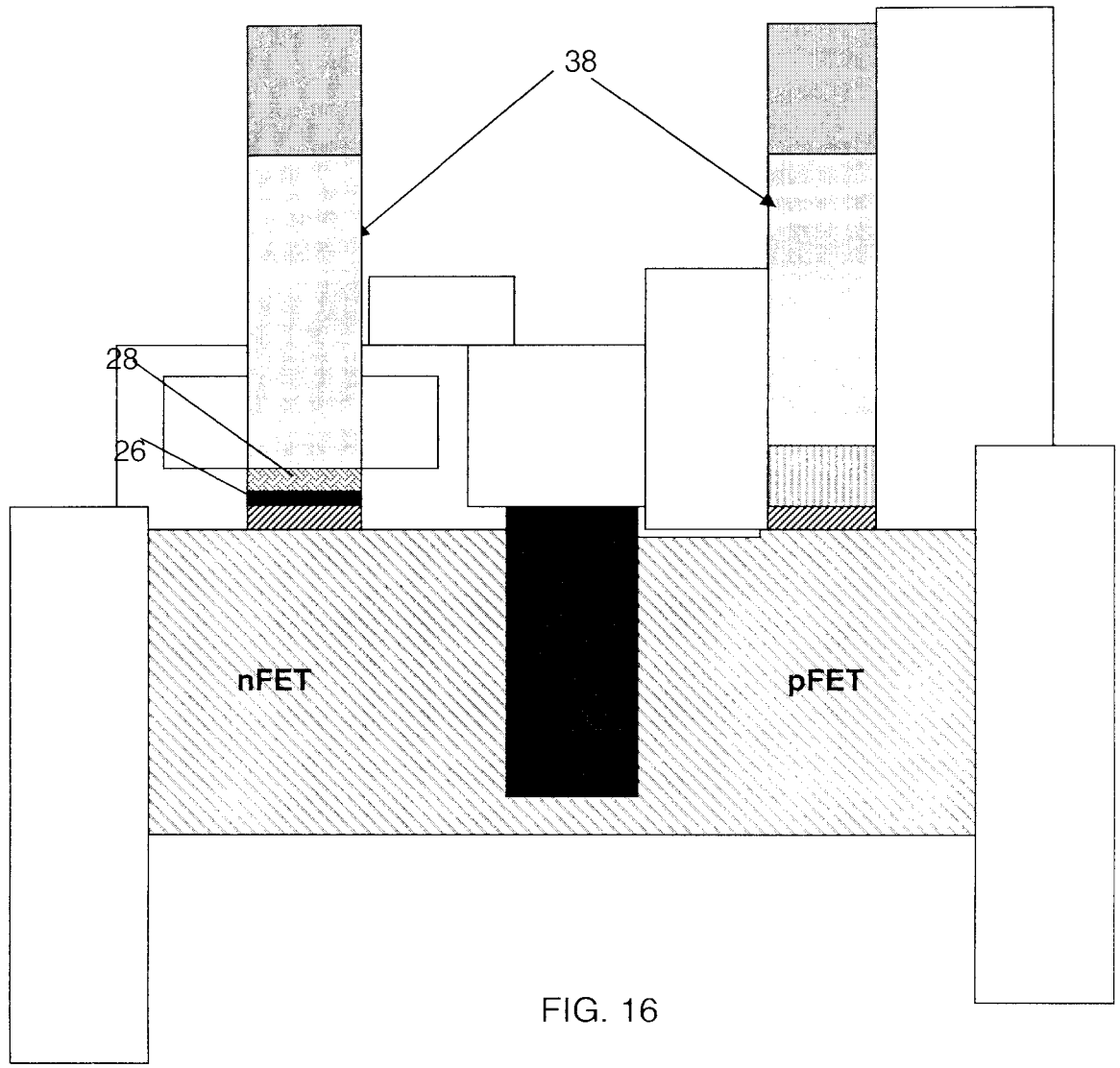
FIG. 16 represents a final structure and processing steps in accordance with the invention.

In FIG. 15, further etching is performed into the lower layers to form the gates 38 over the nFET region and the pFET region. As shown and should now be recognized, the gates can be formed without the need for an additional litho layer from over the nFET region of the device. In addition, in this self-aligning process, the STI region is devoid of stringers, i.e., deposits of poly material in inadvertently damaged portions of the STI surface, which occurs when a second litho layer is etched over the nFET region of the device.

Figure 17:
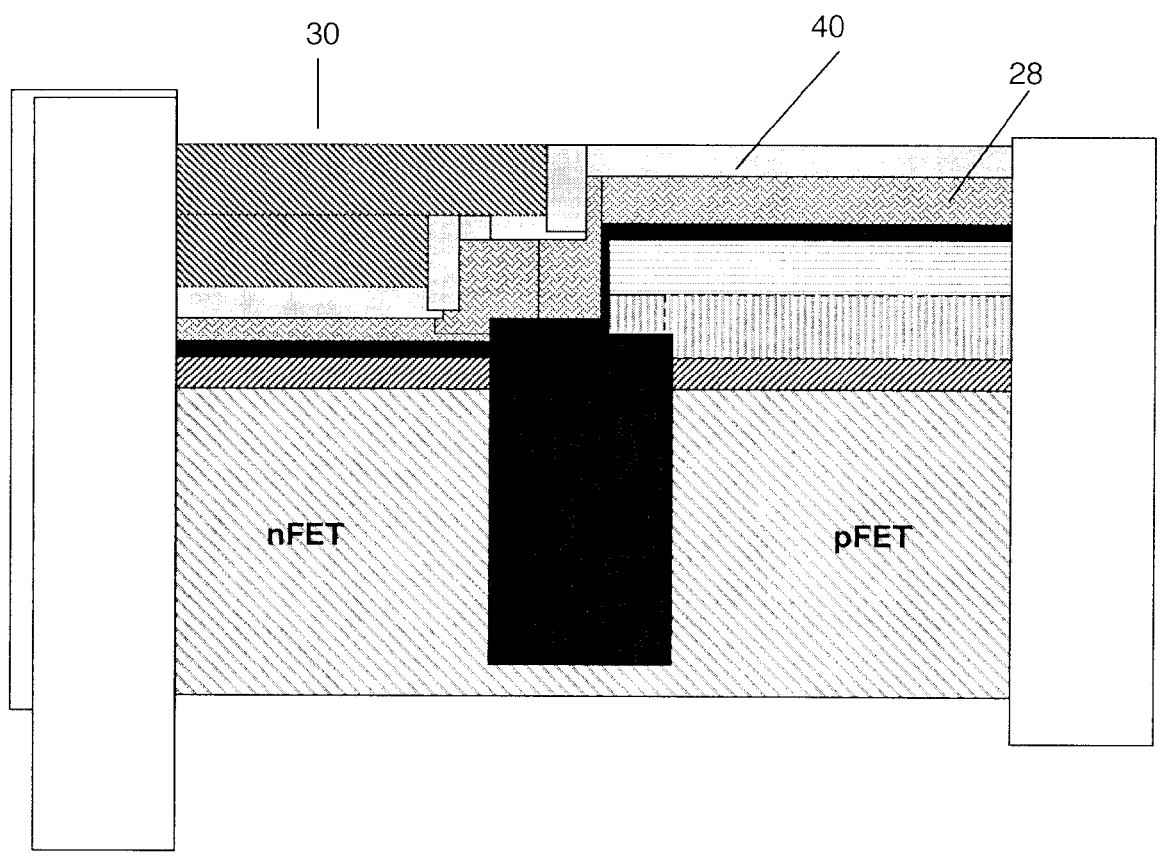
FIG. 17 shows an alternative embodiment and processing steps in accordance with the invention.

FIG. 17 shows an alternative embodiment and processing steps in accordance with the invention. In the alternative embodiment of FIG. 17, a Si layer 40 is formed over the metal layer 28. Subsequently, the oxide layer 30 (shown in FIG. 10) is formed on the Si layer 40 over the nFET region. As in FIG. 10, the oxide layer 30 is planarized to expose a portion of the Si layer 40 over the pFET region. Again, in this manner, the oxide layer 30 is self aligning, eliminating the need for an additional litho process.

The embodiment of FIG. 17 also provides an additional margin in the self aligning process. For example, in subsequent etching steps, it is possible to stop the etching prior to the metal layer 12, still accentuating the stepped region 12a. The remaining processing steps of FIGS. 11-16 remain substantially the same, thereby forming the structure of FIG. 16 (with an additional layer in the gate stack(s)).

Figure 18:
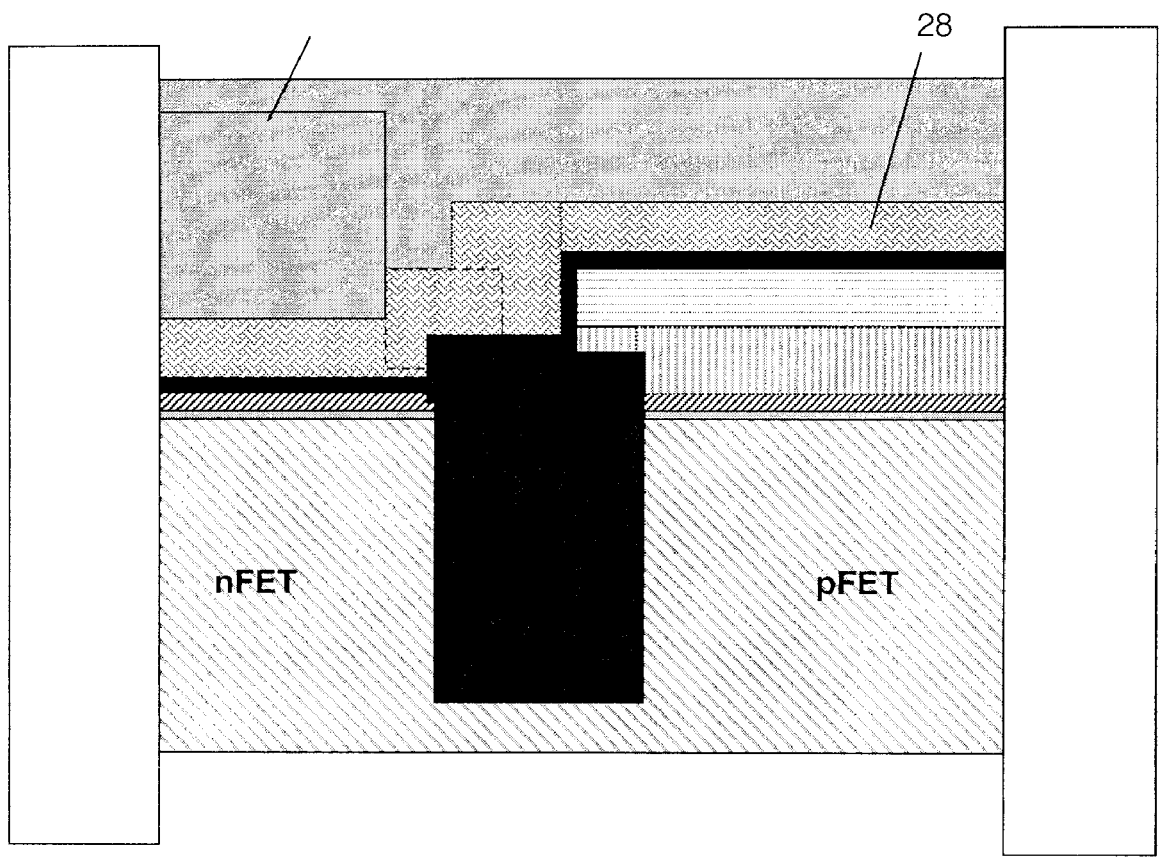
FIG. 18 shows an alternative embodiment and processing steps in accordance with the invention.

FIG. 18 shows an alternative embodiment and processing steps in accordance with the invention. In FIG. 18, a spin on planarizing layer 42 is formed over the entire metal layer 28. The spin on planarizing layer 42 will effectively take the place of the oxide layer 30, deposited in the processing steps of FIG. 10. In the embodiment of FIG. 18, the spin on planarizing layer 42 is self planarizing thus eliminating any mechanical and/or chemical planarizing process. The spin on planarizing layer 42 may be any known spin on material such as, for example, an oxide and more specifically $SiO_2$. The processing steps of FIGS. 11-16 remain substantially the same, thereby forming the structure of FIG. 16 (with an additional layer in the gate stack(s)).

Figure 19:
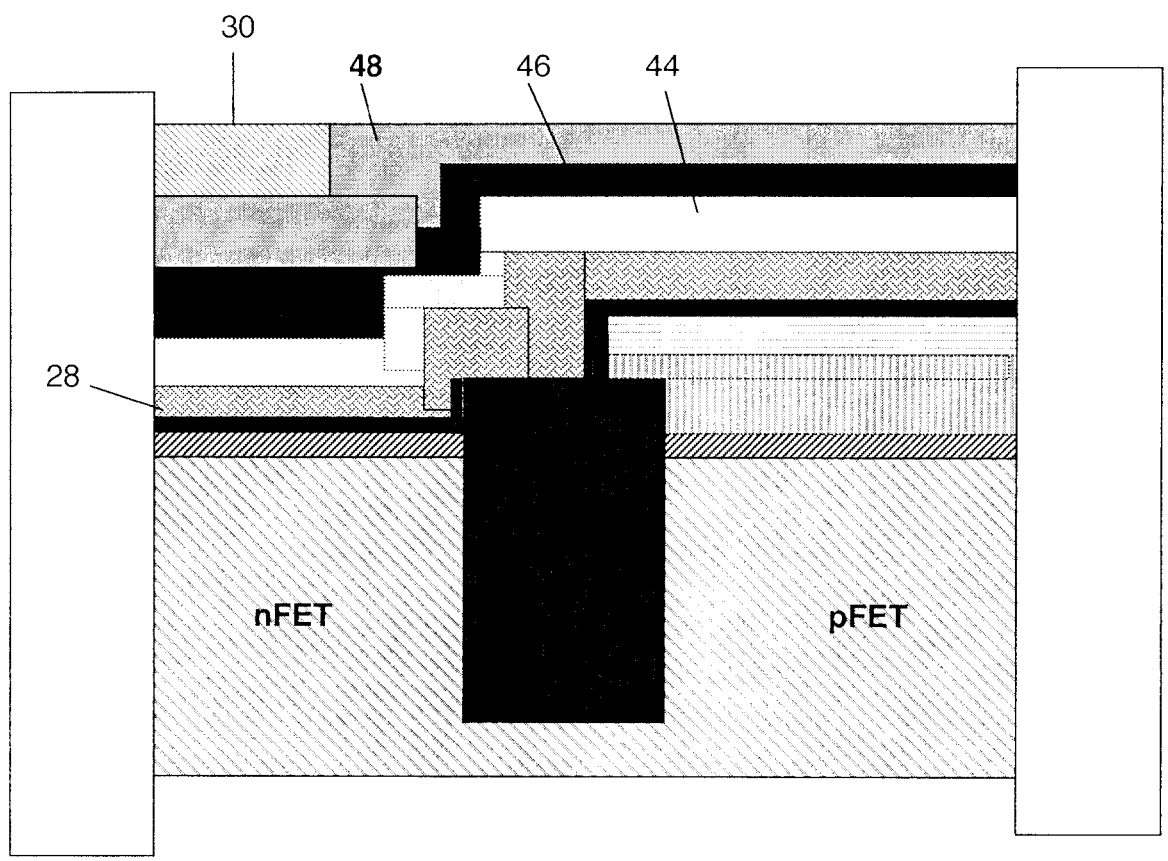
FIG. 19 shows an alternative embodiment and processing steps in accordance with the invention.

FIG. 19 shows an alternative embodiment and processing steps in accordance with the invention. In FIG. 19, additional layers 44, 46 and 48 are provided between the metal layer 28 and the oxide layer 30. The additional layers include, for example, a Si layer 44, an $SiO_2$ layer 44 and an SiN layer 44, all formed in a conventional manner. Again, over the nFET region, the oxide layer 30 is formed. In this embodiment, the oxide layer 30 is formed over the $SiO_2$ layer 44, but does not overlap with the STI 12. In this embodiment, the additional layers 44, 46, 48 may be used to form the gate stacks, on at least the nFET region. Also, as shown in FIG. 19, the additional layers 44, 46, 48 effectively move the stepped region further into the nFET region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

What is claimed is:

1. A method, comprising:

depositing an oxide layer over a portion of a metal layer over an nFET region of a CMOS structure;

etching the metal layer over a pFET region of the CMOS structure;

etching the oxide layer over the nFET region;

forming gate structures over the nFET region and pFET region;

forming an STI region between the nFET region and the pFET region, wherein the etching the portion of the metal layer and the oxide layer exposes a portion of the metal layer over the STI region while leaving the oxide layer abutting against the metal layer over a portion of the STI region, wherein the portion of the metal layer over the STI region protects the STI from formation of stringers during the formation of the gate structures, the oxide layer is self aligned over the nFET region, the depositing of the oxide layer includes depositing the oxide layer over the pFET region, and further comprising planarizing the oxide layer to such an extent that the metal layer is exposed over the pFET region and the oxide layer abuts a portion of the metal layer over an STI region, the depositing of the oxide layer abuts against a raised portion of the metal layer eliminating a gap or overlay region over an STI region, and the metal layer is TiN which is exposed over the pFET region.

* * * * *